US009991323B2

(12) United States Patent
Yokota et al.

(10) Patent No.: US 9,991,323 B2
(45) Date of Patent: Jun. 5, 2018

(54) BLUE ORGANIC EL ELEMENT, ORGANIC EL DISPLAY PANEL, AND MANUFACTURING METHOD OF BLUE ORGANIC EL ELEMENT

(71) Applicants: JOLED INC., Tokyo (JP); Japan Display Inc., Tokyo (JP)

(72) Inventors: Kazuhiro Yokota, Tokyo (JP); Masaki Nishimura, Tokyo (JP); Hiroyuki Ajiki, Tokyo (JP)

(73) Assignees: JOLED INC., Tokyo (JP); Japan Display Inc., Tokyo (JP)

( * ) Notice: Subject to any disclaimer, the term of this patent is extended or adjusted under 35 U.S.C. 154(b) by 84 days.

(21) Appl. No.: 15/150,065

(22) Filed: May 9, 2016

(65) Prior Publication Data
US 2016/0329388 A1    Nov. 10, 2016

(30) Foreign Application Priority Data

May 8, 2015 (JP) ................................. 2015-095698

(51) Int. Cl.
H01L 29/08 (2006.01)
H01L 21/00 (2006.01)
H01L 27/32 (2006.01)
H01L 51/50 (2006.01)
H01L 51/52 (2006.01)

(52) U.S. Cl.
CPC ...... H01L 27/3246 (2013.01); H01L 51/5012 (2013.01); H01L 51/5016 (2013.01); H01L 51/5265 (2013.01); H01L 27/323 (2013.01); H01L 27/3211 (2013.01);
(Continued)

(58) Field of Classification Search
CPC ............. H01L 27/3246; H01L 51/5218; H01L 51/5012; H01L 51/5016; H01L 2251/55; H01L 2251/558
USPC ...... 257/40, 59, 72, 79; 438/82, 99, 48, 128, 438/149
See application file for complete search history.

(56) References Cited

U.S. PATENT DOCUMENTS

2017/0200911 A1* 7/2017 Morimoto ........... H01L 51/5044

FOREIGN PATENT DOCUMENTS

JP    5-163488    6/1993
JP    11-288786    10/1999
(Continued)

OTHER PUBLICATIONS

Meng-Ting Lee, et al., Highly Efficient, Deep-Blue Doped Organic Light-Emitting Devices; Advanced Materials, 2005, pp. 2493-2497.

Primary Examiner — Thinh T Nguyen
(74) Attorney, Agent, or Firm — Oblon, McClelland, Maier & Neustadt, L.L.P.

(57) ABSTRACT

An organic electroluminescence (EL) element emitting blue light from a light emitting surface and including: a first electrode; an organic light-emitting layer disposed on the first electrode and/or closer to the light emitting surface than the first electrode; and a second electrode disposed on the organic light-emitting layer and/or closer to the light emitting surface than the organic light-emitting layer. In the organic EL element emitting blue light, the organic light-emitting layer contains an organic light-emitting material emitting, through photoluminescence, blue light that has a CIE y coordinate no greater than 0.13 such that a luminance drop due to film shape is suppressed to 10% or smaller.

13 Claims, 5 Drawing Sheets

(52) U.S. Cl.
CPC ...... *H01L 51/5036* (2013.01); *H01L 2251/55* (2013.01); *H01L 2251/558* (2013.01)

(56) References Cited

FOREIGN PATENT DOCUMENTS

| | | |
|---|---|---|
| JP | 2000-323277 | 11/2000 |
| JP | 2014-75260 | 4/2014 |

* cited by examiner

BLUE ORGANIC EL ELEMENT, ORGANIC EL DISPLAY PANEL, AND MANUFACTURING METHOD OF BLUE ORGANIC EL ELEMENT

This application is based on an application No. 2015-95698 filed in Japan, the contents of which are hereby incorporated by reference.

BACKGROUND OF THE DISCLOSURE (1) Technical Field

The present disclosure relates to an organic electroluminescence (EL) element emitting blue light (referred to as a blue organic EL element in the following), an organic EL display panel, and a manufacturing method of a blue organic EL element. In particular, the present disclosure relates to a technology improving the quality of an organic light-emitting layer formed by using a wet process.

(2) Description of Related Art

A typical organic EL element includes, layered in the stated order, a first electrode, an organic light-emitting layer, and a second electrode. Such a typical organic EL element emits light due to organic light-emitting material contained in the organic light-emitting layer being put in excitation state when carriers (i.e., holes and electrons) supplied from the first electrode and the second electrode recombine in the organic light-emitting layer. Meanwhile, a typical organic EL display panel includes a plurality of organic EL elements forming a matrix along a top surface of a substrate, and displays images by combining light emitted from the organic EL elements. Recently, development is in progress of a technology increasing both the performance and the mass-productivity of such organic EL elements and organic EL display panels.

As an example of such technology, conventional technology is disclosed of utilizing the effect of optical interference occurring between light reflected by the first electrode, light reflected by the second electrode, etc., in order to improve the color purity, the luminance, etc., of light emitted from organic EL elements and organic EL display panels (for example, refer to Japanese Patent Application Publication No. 2000-323277). Specifically, this conventional technology improves the color purity, the luminance, etc., of light emitted from an organic EL element by adjusting layer structure of the organic EL element (e.g., by adjusting the arrangement of layers and the thickness of layers) and thereby optimizing the difference between lengths of optical paths along which light travels in the organic EL element. In addition, conventional technology is disclosed of strengthening the effect of the optical interference by forming an optical microresonator in an organic EL element by providing both the first electrode and the second electrode with optical reflectivity, and thereby causing an optical stationary wave to be generated in the organic EL element (for example, refer to Japanese Patent Application Publication No. H11-288786).

Further, conventional technology is disclosed of forming organic light-emitting layers by using a so-called wet process, which involves application and drying of ink containing an organic light-emitting material dissolved in an organic solvent, in order to improve the accuracy with which organic light-emitting layers are formed and to improve the efficiency of material use during the forming of organic light-emitting layers (for example, refer to Japanese Patent Application Publication No. 2014-075260). Typically, when forming organic light-emitting layers by using a wet process, the organic light-emitting layers are formed within openings defined by a bank layer. Forming organic light-emitting layers within such openings has the effect of reducing a decrease in accuracy with which the organic light-emitting layers are formed that would otherwise occur due to an undesirable spread of applied ink.

SUMMARY OF THE DISCLOSURE

Meanwhile, in forming organic light-emitting layers by using a wet process as described above, pinning of ink to the bank layer occurs. This pinning makes forming planar organic light-emitting layers difficult, and results in the forming of organic light-emitting layers having concave top surfaces. Specifically, an organic light-emitting layer formed by using a wet process may have a concave top surface whose height decreases as approaching a center portion of the organic light-emitting layer from an outer portion of the organic light-emitting layer. In addition, under certain manufacturing conditions, the concave top surface may also have surface irregularities. Here, it should be noted that when an organic light-emitting layer in an organic EL element has a non-planar film shape as described, the effect of the optical interference with respect to the light emitted from the organic EL element would be undesirably complex, and may negatively affect the color purity, the luminance, etc., of light emitted from the organic EL element. In particular, the negative influence brought about by a non-planar organic light-emitting layer is great for blue organic EL elements. This is since blue light has relatively short wavelength, and thus, the variance in lengths of optical paths resulting from the non-planar organic light-emitting layer would bring about a relatively great phase difference between blue light components having travelled through the different optical paths.

In view of the above, the present disclosure aims to provide a blue organic EL element whose light emission is not affected much by a film shape of the organic light-emitting layer included therein, an organic EL display panel including the blue organic EL element, and a manufacturing method of the blue organic EL element.

One aspect of the present disclosure is an organic electroluminescence (EL) element emitting blue light from a light emitting surface and including: a first electrode; an organic light-emitting layer disposed on the first electrode and/or closer to the light emitting surface than the first electrode; and a second electrode disposed on the organic light-emitting layer and/or closer to the light emitting surface than the organic light-emitting layer. In the organic EL element emitting blue light, the organic light-emitting layer contains an organic light-emitting material emitting, through photoluminescence, blue light that has a CIE y coordinate no greater than 0.13 such that a luminance drop due to film shape is suppressed to 10% or smaller.

BRIEF DESCRIPTION OF THE DRAWINGS

These and other objects, advantages, and features of the technology pertaining to the present disclosure will become apparent from the following description thereof taken in conjunction with the accompanying drawings, which illustrate at least one specific embodiment of the technology pertaining to the present disclosure.

DESCRIPTION OF EMBODIMENT

<Overview of Aspects of Present Disclosure>

Figure 1:
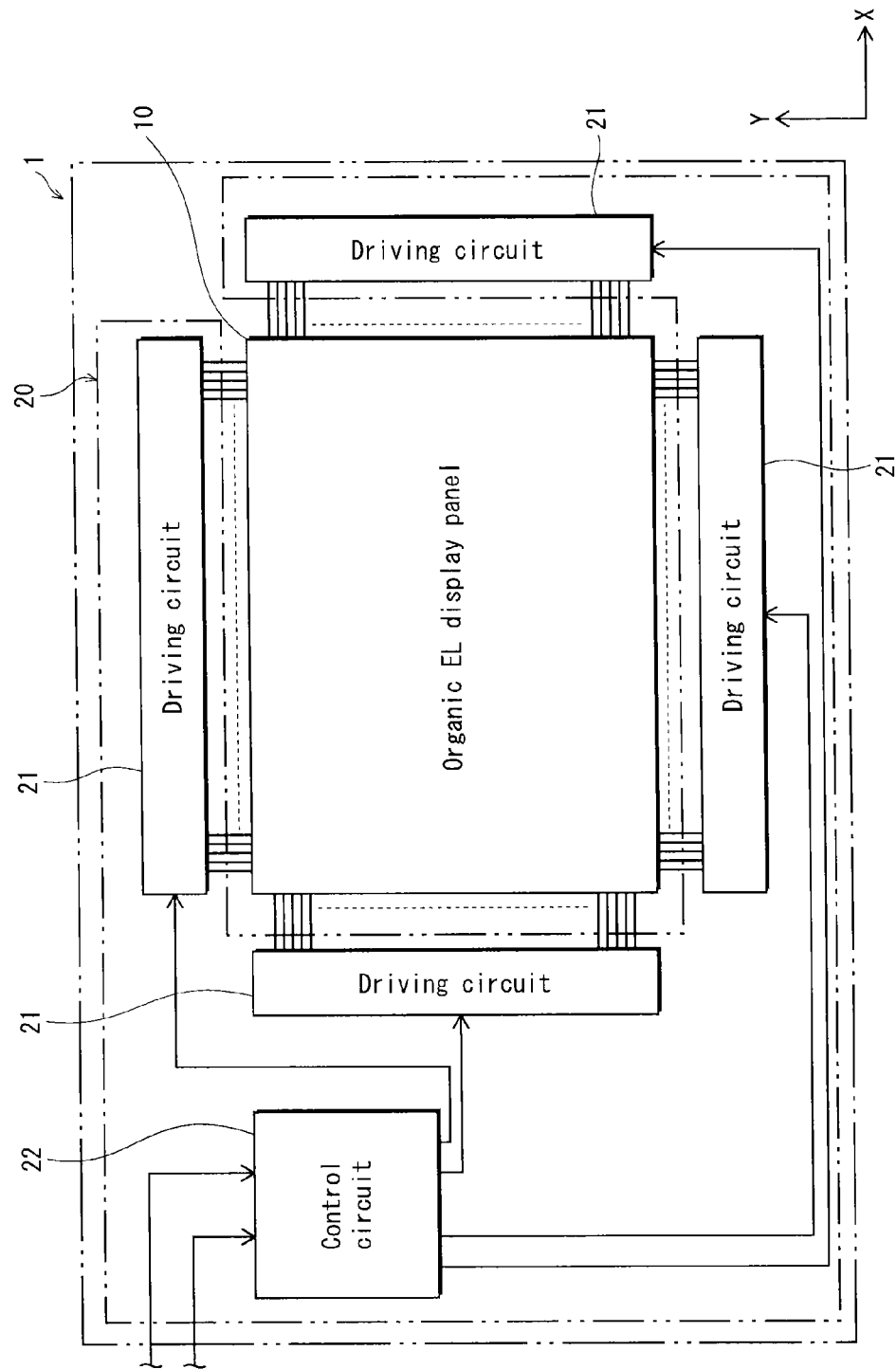
FIG. 1 is a block diagram illustrating the structure of an organic EL display device 1.

One aspect of the present disclosure is an organic electroluminescence (EL) element emitting blue light from a light emitting surface and including: a first electrode; an organic light-emitting layer disposed on the first electrode and/or closer to the light emitting surface than the first electrode; and a second electrode disposed on the organic light-emitting layer and/or closer to the light emitting surface than the organic light-emitting layer. In the organic EL element emitting blue light, the organic light-emitting layer contains an organic light-emitting material emitting, through photoluminescence, blue light that has a CIE y coordinate no greater than 0.13 such that a luminance drop due to film shape is suppressed to 10% or smaller.

The organic EL element emitting blue light pertaining to one aspect of the present disclosure has an organic light-emitting layer containing organic light-emitting material that emits a deep blue color. As such, a luminance drop due to film shape is smaller with the blue organic EL element pertaining to one aspect of the present disclosure than with an organic EL element whose organic light-emitting layer contains organic light-emitting material that emits a light blue color. As such, it can be said that light emission from the blue organic EL element pertaining to one aspect of the present disclosure is not affected much by the film shape of the organic light-emitting layer.

In the organic EL element emitting blue light pertaining to one aspect of the present disclosure, at least a part of the organic light-emitting layer may act as a light-emitting portion, and a difference between a maximum and a minimum thickness of the organic light-emitting layer within the light-emitting portion may be no smaller than 10% of an average thickness of the organic light-emitting layer within the light-emitting portion.

In the organic EL element emitting blue light pertaining to one aspect of the present disclosure, in at least one cross-section of the organic EL element, a planar portion of the light-emitting portion may occupy no more than two thirds of a length of the organic light-emitting layer.

In the organic EL element emitting blue light pertaining to one aspect of the present disclosure, the organic light-emitting layer may have a concave top surface.

In the organic EL element emitting blue light pertaining to one aspect of the present disclosure, at least one of the first electrode and the second electrode may have optical reflectivity.

In the organic EL element emitting blue light pertaining to one aspect of the present disclosure, the first electrode and the second electrode, together, may form an optical microresonator that amplifies blue light.

With such structures, the luminance drop due to film shape is considerably smaller with the blue organic EL element pertaining to one aspect of the present disclosure than with an organic EL element whose organic light-emitting layer contains organic light-emitting material that emits a light blue color.

In the organic EL element emitting blue light pertaining to one aspect of the present disclosure, the organic light-emitting material may emit, through photoluminescence, blue light that has a CIE y coordinate no smaller than 0.05.

With such a structure, the blue organic EL element pertaining to one aspect of the present disclosure achieves high light-emission efficiency.

In the organic EL element emitting blue light pertaining to one aspect of the present disclosure, at least at a part of the organic light-emitting layer, a thickness of the organic light-emitting layer may decrease when approaching a center portion of the organic light-emitting layer from an outer portion of the organic light-emitting layer.

One aspect of the present disclosure is an organic EL display panel including: a substrate; a bank layer disposed on the substrate and/or closer to a light emitting surface than the substrate, the bank layer defining opening areas; and a plurality of organic EL elements, the plurality of organic EL elements each including an organic light-emitting layer disposed in a respective one of the opening areas. In the organic EL display panel, the plurality of organic EL elements include at least one organic EL element emitting blue light, and an organic light-emitting layer of the at least one organic EL element emitting blue light contains an organic light-emitting material emitting, through photoluminescence, blue light that has a CIE y coordinate no greater than 0.13 such that a luminance drop due to film shape is suppressed to 10% or smaller.

In the organic EL display panel pertaining to one aspect of the present disclosure, the plurality of organic EL elements may include a plurality of organic EL elements emitting blue light, the plurality of organic EL elements may form rows and columns along a top surface of the substrate forming a matrix, and the matrix may include at least one column composed of only the plurality of organic EL elements emitting blue light.

The organic EL display panel pertaining to one aspect of the present disclosure has high quality for including a blue organic EL element whose light emission is not affected much by the film shape of the organic light-emitting layer.

In the organic EL display panel pertaining to one aspect of the present disclosure, at least a part of the organic light-emitting layer may act as a light-emitting portion, a difference between a maximum and a minimum thickness of the organic light-emitting layer at the light-emitting portion may be no smaller than 10% of an average thickness of the organic light-emitting layer within the light-emitting portion, and in a transverse cross-section of each column in the matrix, a planar portion of the light-emitting portion may occupy no more than two thirds of a length of the organic light-emitting layer.

With such a structure, the luminance drop due to film shape is considerably smaller with the organic EL panel pertaining to one aspect of the present disclosure than with an organic EL panel including an organic EL element whose organic light-emitting layer contains organic light-emitting material that emits a light blue color.

In the organic EL display panel pertaining to one aspect of the present disclosure, the opening areas may extend along the columns in the matrix forming an extended opening area, and in each of the opening areas, a respective organic light-emitting layer of a respective organic EL element disposed in the respective opening area may be continuous with organic light-emitting layers of each of remaining organic EL elements disposed in the extended opening area.

Further, in the organic EL display panel pertaining to one aspect of the present disclosure, the bank layer may have a line bank structure.

One aspect of the present disclosure is a manufacturing method of an organic EL element emitting blue light and including a first electrode, an organic light-emitting layer, and a second electrode that are layered in a stated order, the manufacturing method including: forming the organic light-emitting layer through application and drying of an ink containing an organic light-emitting material, the organic light-emitting material emitting, through photoluminescence, blue light that has a CIE y coordinate no greater than 0.13 such that a luminance drop due to film shape is suppressed to 10% or smaller.

The manufacturing method pertaining to one aspect of the present disclosure produces a blue organic EL element that has an organic light-emitting layer containing organic light-emitting material that emits a deep blue color. As such, the luminance drop due to film shape is smaller with the blue organic EL element manufactured according to the manufacturing method pertaining to one aspect of the present disclosure than with an organic EL element whose organic light-emitting layer contains organic light-emitting material that emits a light blue color.

Note that in the present disclosure, any term or expression related to an upward direction should be construed as referring to a relatively upward direction that is determined relatively based on the positional relationships between elements of an organic EL element/organic EL display panel having multiple layers layered in a certain order, and should not be construed as referring to an absolute upward direction (i.e., the vertical direction). For example, in the present disclosure, an upward direction in an organic EL display panel is a direction perpendicular to a main surface of a substrate of the organic EL display panel and directing from the substrate towards layers stacked on or above the substrate.

Further, in the present disclosure, any element referred to as having a concave shape is an element whose height decreases as approaching a center portion thereof from an outer portion thereof. However, it should be noted that an element having a concave shape should not be construed as having a concave shape in a strict sense such that the decrease in height thereof from an outer portion thereof towards the center portion thereof is continuous without any interruption. That is, when taking a top surface of an organic light-emitting element for example, a concave shape of the top surface covers not only a case where the height of the top surface decreases continuously from an outer portion of the top surface towards a center portion of the top surface, but also for example, a case where a convex portion with relatively small height compared to the difference in height between the outer portion and the center portion exists along the top surface between the outer portion and the center portion, or that is, cases where any surface irregularity exists between the outer portion and the center portion. In addition, in the present disclosure, a height of a top surface of an organic light-emitting layer refers to a distance along an upward direction between a bottom surface of a first electrode to the top surface of the organic light-emitting layer.

Further, in the present disclosure, "deep blue" light refers to blue light with a relatively small CIE y coordinate, and "light blue" light refers to blue light with a relatively great CIE y coordinate.

Embodiment

The following describes an organic EL display device 1 including an organic EL display panel 10, with reference to the accompanying drawings. Note that one or more of the drawings may be schematics, and in such drawings, elements may be illustrated in sizes differing from their actual sizes and the ratio between the vertical-direction length and the horizontal-direction length of elements may differ from their actual ratio.

1. Structure of Organic EL Display Device 1

FIG. 1 is a block diagram illustrating the structure of the organic EL display device 1. The organic EL display device 1 is a display device used in a device such as a television, a personal computer, a portable terminal, or a commercial display (for example, an electronic signage or a large-sized screen for installment in a commercial facility). The organic EL display device 1 includes the organic EL display panel 10 and a driving control unit 20. The driving control unit 20 is electrically connected to the organic EL display panel 10.

In the embodiment, the organic EL display panel 10 (referred to in the following as a panel 10) is a top-emission-type display panel, and has a rectangular top surface that serves as an image display surface. Further, the panel 10 includes pixels that form a matrix along the image display surface, and displays images by combining colors of light emitted from the pixels. Each pixel includes a plurality of organic EL elements. In addition, in the embodiment, the panel 10 uses the active-matrix scheme.

The driving control unit 20 includes driving circuits 21 and a control circuit 22. The driving circuits 21 are connected to the panel 10. The control circuit 22 is connected to an external device such as a calculator or a receiver (e.g., an antenna). Each driving circuit 21 includes: a power supply circuit that supplies power to pixels; a signal circuit applying voltage signals for controlling the power supplied to the pixels; and a scan circuit for changing the pixels to which the voltage signals are applied. The control circuit 22 controls operations of the driving circuits 21 according to data including, for example, the state of the panel 10 and image information received from the external device connected thereto.

In FIG. 1, the driving control unit 20 includes four driving circuits 21 arranged to surround the panel 10. However, the structure of the driving control unit 20 is not limited to that illustrated in FIG. 1, and the number, the arrangement positions, etc., of the driving circuits 21 may be changed as necessary. Further, in the following, a direction parallel to the longer sides of the top surface of the panel 10 is referred to as an X direction, and a direction parallel to shorter sides of the top surface of the panel 10 is referred to as a Y direction, as illustrated in FIG. 1.

2. Structure of Panel 10

Figure 2:
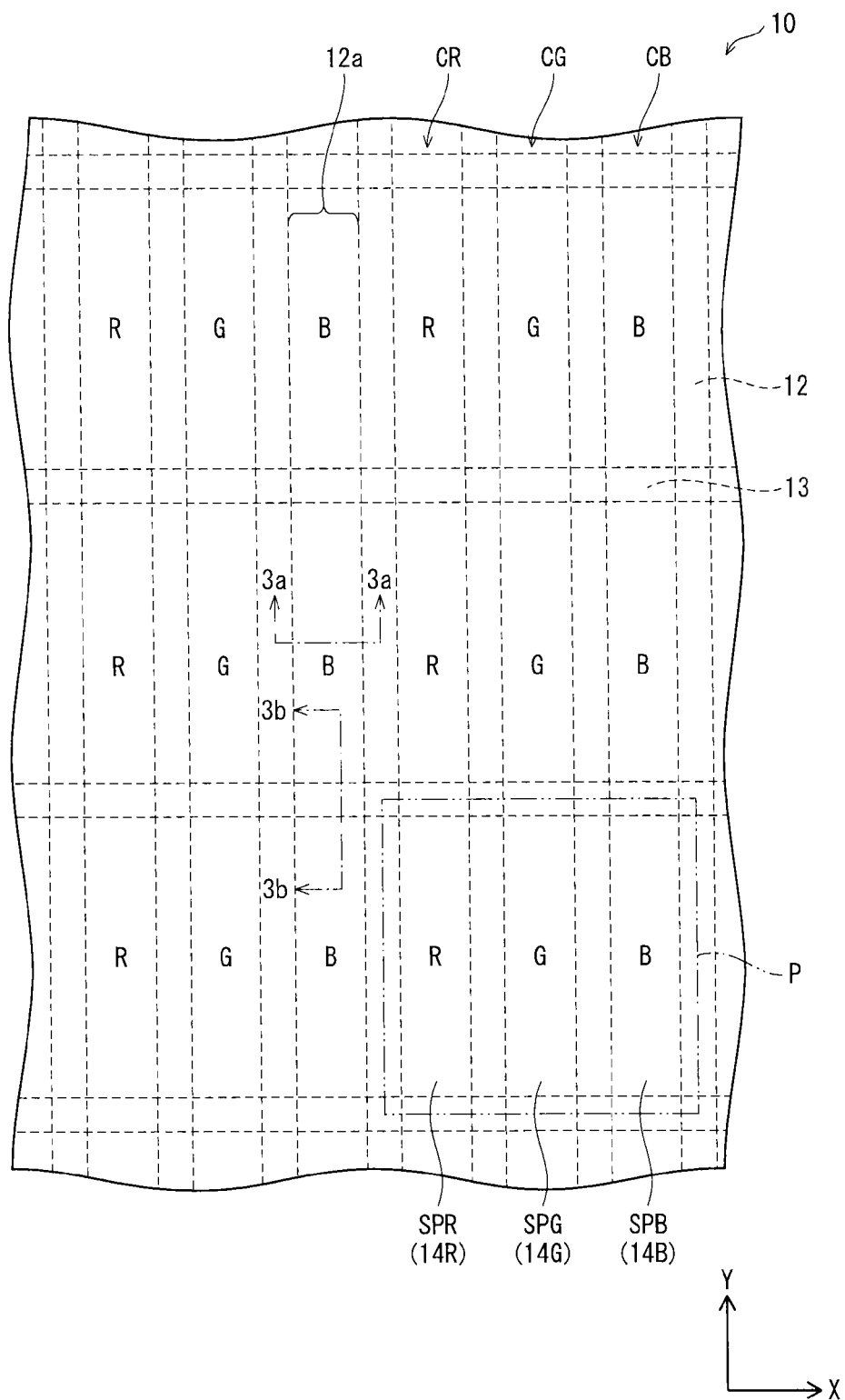
FIG. 2 is a schematic providing a magnified plan view of a part of an image display surface of an organic EL display panel 10.

First, the following describes the overall structure of the panel 10 with reference to FIG. 2. FIG. 2 is a schematic providing a magnified plan view of a part of the image display surface of the panel 10. The panel 10 includes red sub-pixels SPR, green sub-pixels SPG, and blue sub-pixels SPB. Each red sub-pixel SPR includes one red organic EL element 14R, each green sub-pixel SPG includes one green organic EL element 14G, and each blue sub-pixel SPB includes one blue organic EL element 14B. The red organic EL element 14R, the green organic EL element 14G, and the blue organic EL element 14B respectively emit red light, green light, and blue light. Accordingly, the red sub-pixel SPR, the green sub-pixel SPG, and the blue sub-pixel SPB respectively emit red light, green light, and blue light. Note that in the following, the term "organic EL element(s) 14" is used when it is unnecessary to distinguish the red organic EL element 14R, the green organic EL element 14G, and the blue organic EL element 14B from one another. Further, the color of light emitted from a given sub-pixel (i.e., the red sub-pixel SPR, the green sub-pixel SPG, or the blue sub-pixel SPB) may be the color of light emitted from the organic EL element 14 included in the sub-pixel, or may be a color yielded by adjusting the color of light emitted from the organic EL element 14 by using a color filter.

In the panel 10, each X-direction line (i.e., each row in the matrix) includes a plurality of sub-pixel sets. Each sub-pixel set is composed of one red sub-pixel SPR, one green sub-pixel SPG, and one blue sub-pixel SPB disposed adjacently in this order. Each of such sub-pixel sets corresponds to one pixel P of the panel 10. Each pixel P is capable of full color representation, due to the luminance or intensity of light emitted from each sub-pixel (the red sub-pixel SPR, the green sub-pixel SPG, and the blue sub-pixel SPB) being gradually controllable.

Meanwhile, in the panel 10, each Y direction-line (i.e., each column in the matrix) includes only sub-pixels of the same color (red sub-pixels SPR, green sub-pixels SPG or blue sub-pixels SPB). Thus, in the following, each Y direction-line including only red sub-pixels SPR is referred to as a red sub-pixel column CR, each Y direction-line including only green blue-pixels SPG is referred to as a green sub-pixel column CG, and each Y direction-line including only blue sub-pixels SPB is referred to as a blue sub-pixel column CB. Accordingly, in the panel 10, a plurality of pixels P are arranged in each of the X direction and the Y direction, and thus compose a matrix.

In the embodiment, the panel 10 employs the line bank structure. Specifically, the panel 10 includes a bank layer 12 partitioning one sub-pixel column from another. In other words, the bank layer 12 defines opening areas 12a, each of which having a shape corresponding to the shape of one sub-pixel column. Further, the panel 10 includes a pixel insulating layer 13. Specifically, in each sub-pixel column, the pixel insulating layer 13 provides insulation between each pair of sub-pixels that are adjacent along the Y direction. Such a structure enables each red sub-pixel SPR, each green sub-pixel SPG, and each blue sub-pixel SPB to emit light independently. Specifically, in the panel 10, the bank layer 12 is a combination of a plurality of linear banks each extending along the Y direction, and the pixel insulating layer 13 is a combination of a plurality of linear insulating layers each extending along the X direction. In FIG. 2, the bank layer 12 and the pixel insulating layer 13 are each indicated by using dotted lines. This shows that the bank layer 12 and the pixel insulating layer 13 are not visible when the panel 10 is viewed from outside the image display surface, and are located inside the image display surface.

Figure 3A:
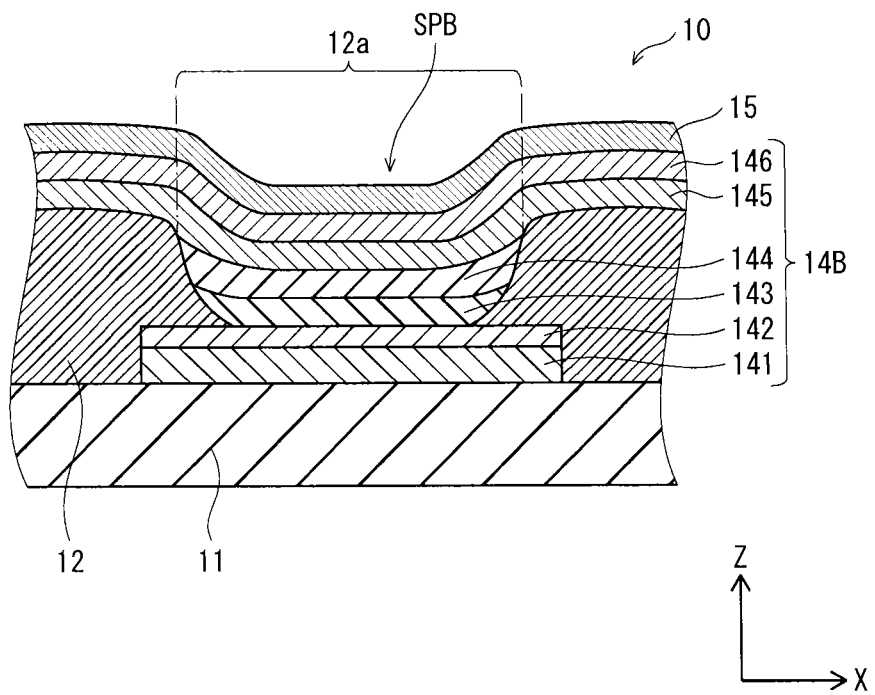
FIG. 3A is a schematic illustrating a cross-section taken along line 3a-3a in FIG. 2.
Figure 3B:
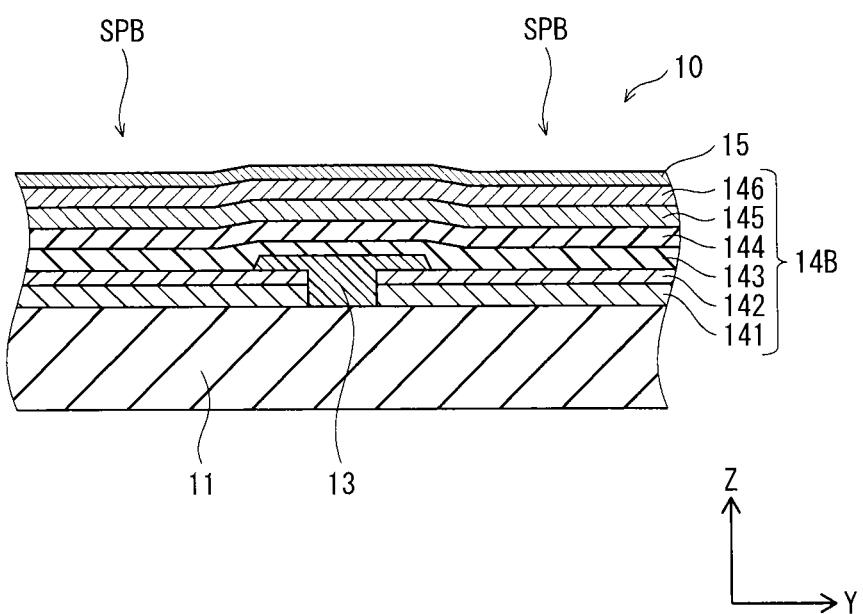
FIG. 3B is a schematic illustrating a cross-section taken along line 3b-3b in FIG. 2.

The following describes the specific structure of the panel 10, with reference to FIGS. 3A and 3B. FIG. 3A is a schematic illustrating a cross-section taken along line 3a-3a in FIG. 2, and FIG. 3B is a schematic illustrating a cross-section taken along line 3b-3b in FIG. 2 In the following, a direction perpendicular to both the X direction and the Y direction, or in other words, the direction towards the top surface, from which the panel 10 emits light, is referred to as a Z direction, as illustrated in FIGS. 3A and 3B. Note that in the following, description is provided based on blue organic EL elements 14B among the three types of organic EL elements 14. Note that the red organic EL elements 14R and the green organic EL elements 14G not discussed in specific in the following may have the same structure as the blue organic EL elements 14B or may have structures completely differing from the structure of the blue organic EL elements 14B.

The panel 10 includes the bank layer 12, the pixel insulating layer 13, and the organic EL elements 14, and also includes a substrate 11 and a sealing layer 15. The following describes such elements of the panel 10.

(1) Blue Organic EL Element 14B

Each blue organic EL element 14B is disposed between the substrate 11 and the sealing layer 15 in one opening area 12a, at a position corresponding to one blue sub-pixel SPB. The blue organic EL element 14B includes, layered one on top of another in the stated order: a first electrode 141; a hole injection layer 142; a hole transport layer 143; an organic light-emitting layer 144; an electron transport layer 145; and a second electrode 146.

a. First Electrode 141

The first electrode 141 is formed by using a metal material and has a flat plate-like shape. The first electrode 141 serves as an anode and supplies holes to the organic light-emitting layer 144. In the panel 10, which uses the active-matrix scheme, a separate first electrode 141 is provided for each organic EL element 14. Accordingly, in the panel 10, a plurality of first electrodes 141 are arranged in each of the X direction and the Y direction above the substrate 11, and thus compose a matrix.

Examples of metal materials usable for forming the first electrode 141 include: aluminum (Al), silver (Ag), molybdenum (Mo), tungsten (W), titanium (Ti), chromium (Cr), nickel (Ni), zinc (Zn), copper (Cu), gold (Au), platinum (Pt), and palladium (Pd). Alternatively, the first electrode 141 may be formed by using an alloy material being a combination of at least two metal materials. Alternatively, the first electrode 141 may be formed to include multiple layers, with each layer formed by using a metal material, an alloy material, or the like. Further, a layer formed by using an oxide material having both light transmissivity and electrical conductivity, such as indium tin oxide (ITO) or indium zinc oxide (IZO), may be formed on the top surface of the first electrode 141, in order to strengthen the adhesion between the first electrode 141 and the hole injection layer 142, to prevent oxidization of any metal material contained in the first electrode 141, or for other purposes. Further, a barrier metal layer formed by using a metal oxide material such as tungsten oxide may be formed on the bottom surface of the first electrode 141, in order to prevent or reduce the risk of erosion of any layer below the first electrode 141 in wet-etching, to prevent or reduce the risk of intrusion of hydrogen into any layer below the first electrode 141, or for other purposes. Further, the first electrode 141 need not be formed by using a metal material. For example, the first electrode 141 may be formed by using an oxide material having both light transmissivity and electrical conductivity, such as indium tin oxide (ITO) or indium zinc oxide (IZO), or by using a carbon material having electrically conductivity, such as graphite or a carbon nanotube.

Meanwhile, considering that the first electrode 141 has the function of supplying holes, the first electrode 141 is beneficially formed by using a material having a high work function. Further, considering that the panel 10 is a top-emission-type display panel, the first electrode 141 beneficially has high optical reflectivity.

For example, the first electrode 141 may be formed by performing a combination of a dry process (e.g., sputtering) and patterning utilizing a metal mask process, photolithography, or the like.

b. Hole Injection Layer 142

The hole injection layer 142 is disposed on the first electrode 141. The hole injection layer 142 improves hole injection efficiency by lowering the energy barrier to be overcome in order to supply (inject) holes from the first electrode 141 to the organic light-emitting layer 144.

The hole injection layer 142 is formed, for example, by using a metal oxide material. Examples of metal oxide materials usable for forming the hole injection layer 142 include oxides of metals such as Ag, Mo, Cr, W, Ni, vanadium (V), and iridium (Ir). Alternatively, the hole injection layer 142 may be formed by using an organic material such as PEDOT (mixture of polythiophene and polystyrene sulfonic acid). Further, the hole injection layer 142 may contain two or more materials, as long as including one of the materials described above.

For example, the hole injection layer 142 may be formed by using a combination of a dry process (e.g., reactive sputtering) and patterning utilizing a metal mask process, photolithography, or the like. Further, continuously forming a layer of the material for the first electrode 141 and a layer of the material for the hole injection layer 142, and then patterning the two layers continuously by performing photolithography utilizing a same photomask improves the accuracy and efficiency of the patterning process. Meanwhile, the patterning of the first electrode 141 and the patterning of the hole injection layer 142 may be performed according to different etching methods. For example, the first electrode 141 may be patterned by performing wet etching, and the hole injection layer 142 may be patterned by performing dry etching.

c. Hole Transport Layer 143

The hole transport layer 143 is disposed within the opening area 12a and on the hole injection layer 142. The hole injection layer 142 promotes the transportation of holes supplied from the first electrode 141 to the organic light-emitting layer 144. Further, as illustrated in FIG. 3B, the hole transport layer 143 extends continuously in the Y direction without being separated by pixel insulating layers 13. Thus, one hole transport layer 143 continuously extends across the plurality of blue organic EL elements 14B disposed adjacent to one another in the opening area 12a. That is, the plurality of blue organic EL elements 14B in a same blue sub-pixel column CB share the same hole transport layer 143.

The hole transport layer 143 is formed, for example, by using an organic material achieving high hole mobility. Example of organic materials usable for forming the hole transport layer 143 include the following materials disclosed in Japanese Patent Application Publication No. H05-163488: a triazole derivative; an oxadiazole derivative; an imidazole derivative; a polyarylalkane derivative; a pyrazoline derivative; a pyrazolone derivative; a phenylenediamine derivative; an arylamine derivative; an amino-substituted chalcone derivative; an oxazole derivative; a styrylanthracene derivative; a fluorenone derivative; a hydrazone derivative; a stilbene derivative; a porphyrin compound; an aromatic tertiary amine compound; a styrylamine compound; a butadiene compound; a polystyrene derivative; a triphenylmethane derivative; and a tetraphenylbenzene derivative. Further, the hole transport layer 143 may contain two or more materials, as long as including one of the materials described above.

The hole transport layer 143 may be formed, for example, by using a wet process such as inkjet deposition or printing.

d. Organic Light-emitting Layer 144

The organic light-emitting layer 144 is disposed above the first electrode 141 within the opening area 12a, or more specifically, on the hole transport layer 143. The organic light-emitting layer 144 is a layer that emits light due to the recombination of holes supplied from the first electrode 141 and the electrons supplied from the second electrode 146 occurring therein. In other words, an electric-field light-emitting phenomenon occurs in the organic light-emitting layer 144. Further, the organic light-emitting layer 144 is formed by using a wet process. Thus, the top surface of the organic light-emitting layer 144 has a concave shape, with the thickness of the organic light-emitting layer 144 decreasing, at least at a part thereof, as approaching a center portion thereof from an outer portion thereof Further, similar to the hole transport layer 143, the organic light-emitting layer 144 extends continuously in the Y direction over pixel insulating layers 13, as illustrated in FIG. 3B. Thus, one organic light-emitting layer 144 continuously extends across the plurality of blue organic EL elements 14B disposed adjacent to one another in the opening area 12a. That is, the plurality of blue organic EL elements 14B in a same blue sub-pixel column CB share the same organic light-emitting layer 144.

The organic light-emitting layer 144 contains an organic light-emitting material that emits blue light that has a CIE y coordinate no greater than 0.13 through photoluminescence. Here, the color of light emitted from an organic light-emitting material through photoluminescence is measured according to the following method in the present disclosure. First, a solution is prepared by dissolving the organic light-emitting material to be used in toluene. Then, the organic light-emitting material contained in the solution is forced to undergo photoluminescence, by being irradiated with light emitted from a xenon lamp or the like that puts the organic light-emitting material in excitation state. Then, the light resulting from the photoluminescence of the organic light-emitting material is detected by using a photodetector, and a spectrum of the light is acquired by using a spectroscope. Finally, the color of light emitted from the organic light-emitting material can be measured by converting the spectrum into chromaticity. Note that in the present disclosure, a CIE y coordinate is the y coordinate among the CIE xy chromaticity coordinates of the CIE 1931 XYZ color space created by the International Commission on Illumination (CIE) in 1931.

The organic light-emitting material to be contained in the organic light-emitting layer 144 may be selected as necessary from conventional phosphorescent materials and conventional fluorescent materials such as those disclosed in Japanese Patent Application Publication No. H05-163488, which include: an oxinoid compound; a perylene compound; a coumarin compound; an azacoumarin compound; an oxazole compound; an oxadiazole compound; a perinone compound; a pyrrolo-pyrrole compound; a naphthalene compound; an anthracene compound; a fluorene compound; a fluoranthene compound; a tetracene compound; a pyrene compound; a coronene compound; a quinolone compound; an azaquinolone compound; a pyrazoline derivative and a pyrazolone derivative; a rhodamine compound; a chrysene compound; a phenanthrene compound; a cyclopentadiene compound; a stilbene compound; a diphenylquinone compound; a styryl compound; a butadiene compound; a dicyanomethylene pyran compound; a dicyanomethylene thiopyran compound; a fluorescein compound; a pyrylium compound; a thiapyrylium compound; a selenapyrylium compound; a telluropyrylium compound; an aromatic alda-diene compound; an oligophenylene compound; a thioxanthene compound; a cyanine compound; an acridine compound; a metal complex of an 8-hydroxyquinoline compound; a metal complex of a 2-bipyridine compound; a complex of a Schiff base and a group III metal; a metal complex of oxine; and rare earth metal complex. Specifically, the organic light-emitting layer 144 may contain for example, as the organic light-emitting material that emits blue light that has a CIE y coordinate no greater than 0.13 through photoluminescence, organic materials disclosed in conventional documents such as Lee et al., Highly efficient, deep-blue doped organic light-emitting devices, Advanced Materials, 17, 2493-2497, 2005. Further, the organic light-emitting layer 144 may contain two or more materials, as long as including one of the organic light-emitting materials described above. For example, the organic light-emitting layer 144 may include a host material achieving high carrier (hole or electron) mobility in addition to one of the organic light-emitting materials described above. Further, the organic light-emitting material in the organic light-emitting layer 144 may be either a low-molecular material or a high-molecular material.

The organic light-emitting layer 144 is formed, for example, by using a wet process such as inkjet deposition or printing. That is, the organic light-emitting layer 144 is formed through application and drying of an ink containing the organic light-emitting material. Specifically, the organic light-emitting layer 144 can be formed through the following procedures. First, an ink prepared by dissolving the organic light-emitting material in an appropriate organic solvent is applied to the inside of the opening area 12a defined by the bank layer 12. Then, the substrate 11 with the ink applied is placed in a vacuum environment for drying. For example, the substrate 11 may be placed in a vacuum chamber. Through the drying, the organic solvent in the ink is caused to evaporate. Thus, the forming of the organic light-emitting layer 144 is completed. Here, applying the ink so that the ink at least completely covers the pixel insulating layers 13 disposed in the opening area 12a enables the ink to flow along the Y direction within the opening area 12a. This reduces the risk of an unevenness in ink application amount. Performing ink application in such a manner yields the organic light-emitting layer 144, which continuously extends across the plurality of blue organic EL elements 14B disposed in the opening area 12a. Thus, the risk is reduced of the thickness of the organic light-emitting layer 144 differing at different areas within the opening area 12a, and further, the panel 10 has high quality.

e. Electron Transport Layer 145

The electron transport layer 145 is disposed on the organic light-emitting layer 144. The electron transport layer 145 promotes the transportation of electrons supplied from the second electrode 146 to the organic light-emitting layer 144. Note that the electron transport layer 145 extends continuously over bank layers 12 and pixel insulating layers 13 as illustrated in FIGS. 3A and 3B. That is, the electron transport layer 145 extends across all the organic EL elements 14 of the panel 10, and thus, all organic EL elements 14 share the same electron transport layer 145.

The electron transport layer 145 is formed, for example, by using an organic material achieving high electron mobility. Examples of organic materials usable for forming the electron transport layer 145 include the organic materials disclosed in Japanese Patent Application Publication No. H05-163488, which include: a nitro-substituted fluorenone derivative; a thiopyran dioxide derivative; a diphenylquinone derivative; a perylene tetracarboxyl derivative; an anthraquinodimethane derivative; a fluoronylidene methane derivative; an anthrone derivative; an oxadiazole derivative; a perinone derivative; and a quinolone complex derivative, and also organic materials such as a phosphorus oxide derivative, a triazole derivative, a triazine derivative, a silole derivative, a dimesitylboron derivative, and a triarylboron derivative. Further, the electron transport layer 146 may contain two or more materials, as long as including one of the materials described above.

For example, the electron transport layer 145 may be formed by using a combination of a dry process (e.g., sputtering) and patterning utilizing a metal mask process, photolithography, or the like.

f. Second Electrode 146

The second electrode 146 is disposed above the organic light-emitting layer 144. Specifically, the second electrode 146 is disposed to cover the electron transport layer 145. The second electrode 146 serves as a cathode and supplies electrons to the organic light-emitting layer 144.

The second electrode 146 is formed, for example, by using a material having electrical conductivity. Examples of materials usable for forming the second electrode 146 include the materials described as materials for the first electrode 141. Meanwhile, considering that the second electrode 146 has the function of supplying electrons, the second electrode 146 is beneficially formed by using a material having a low work function. Further, considering that the panel 10 is a top-emission-type display panel, the second electrode 146 is beneficially formed by using a material having high light transmissivity. Further, reducing the difference in refractive index between the second electrode 146 and the sealing layer 15 achieves efficient use of the light emitted from the organic light-emitting layer 144. Note that forming the second electrode 146 by using a semi-transparent metal or a distributed Bragg reflector (DBR) results in the first electrode 141 and the second electrode 146, together, forming an optical microresonator that strengthens blue light. Forming such an optical microresonator strengthens the effect of the optical interference with respect to the light emitted from the blue organic EL element 14B.

For example, the second electrode 146 may be formed by using a combination of a dry process (e.g., sputtering) and patterning utilizing a metal mask process, photolithography, or the like.

(2) Substrate 11

The substrate 11 supports the panel 10. While not illustrated in the drawings, the substrate 11 includes a main body having a flat rectangular shape and a thin film transistor (TFT) layer disposed on the main body.

The main body is formed, for example, by using a material having an electrically-insulative property. Examples of materials usable for forming the main body include: glass materials such as alkali-free glass, soda glass, nonfluorescent glass, phosphate glass, borate glass, and quartz glass; resin materials such as acrylic resin, styrenic resin, polycarbonate resin, epoxy resin, polyethylene resin, polyester resin, polyimide resin, and silicone resin; and metal oxide materials such as aluminum oxide. Further, the main body may be a combination of a layer of a metal material such as aluminum or stainless steel, and a layer having an electrically-insulative property layered on the metal material layer.

Beneficially, the main body is formed, for example, by using a glass material, a metal material, or the like, so that the main body has a low moisture transmission rate. This is beneficial because typically, an organic EL element undergoes degradation when coming into contact with moisture, oxygen, and the like. Thus, when alternatively forming the main body by using a resin material, beneficially, the main body is a combination of the resin material layer and another layer having a low moisture transmission rate layered on the resin material layer. The layer having a low moisture transmission rate may be formed by using silicon nitride, silicon oxynitride, or aluminum oxide, for example.

The TFT layer includes an electric circuit that controls the supply of power to the organic EL elements 14. The TFT layer includes layers such as a semiconductor layer, a conductor layer, and an electrical insulator layer layered one on top of another. Such layers form electric circuit elements, such as TFT elements, capacitor elements, and wiring. Further, the TFT layer includes an interlayer insulating layer formed, for example, by using a resin material such as an acrylic resin, a polyimide resin, a silicone resin, or a phenol resin. The interlayer insulating layer is the topmost layer in the TFT layer. The interlayer insulating layer provides electrical insulation between the electrical circuit elements formed in the TFT layer and layers in the panel 10 on and above the TFT layer. In addition, the interlayer insulating layer cancels out (planarizes) surface irregularities formed, for example, by the electric circuit elements of the TFT layer. The flat top surface of the interlayer insulating layer has a flat shape in accordance with the top surface of the main body. In addition, the TFT layer may include a passivation layer between the electric circuit elements and the interlayer insulating layer. For example, the passivation layer covers all the electric circuit elements, and may be formed by using a material having an electrically insulating property and a low moisture transmission rate, such as silicon nitride or aluminum oxide.

For example, the substrate 11 may be formed through the following procedures. First, the main body is prepared, by shaping a glass material or the like into a rectangular, flat plate-like shape. Then, multiple layers, such as the semiconductor layer, the conductor layer, and the electrical insulator layer, are formed one after another on the main body. Accordingly, the electric circuit of the TFT layer is formed. The forming of each of such layers is performed by either a dry process or a wet process, depending upon the material for the layer. Examples of dry processes include vacuum vapor deposition, electron beam vapor deposition, ion plating, sputtering, and chemical vapor deposition. Examples of wet processes include spin coating, inkjet deposition, dispensing, die coating, and slit coating. Further, in the forming of each of such layers, patterning may be performed as necessary in order to provide the layer with the desired shape. Methods applicable in the patterning include, for example, a metal mask process, a mask printing process, and photolithography. Further, additional processing, such as plasma doping, ion implantation, or baking, may be performed as necessary on one or more of the layers formed.

Subsequently, the interlayer insulating layer is formed on the main body with the electric circuit formed thereon. For example, the forming of the interlayer insulating layer may be performed through die coating by applying a resin material having a certain level of fluidity along the top surface of the main body with the electric circuit formed thereon. Here, patterning may be performed to form openings (contact holes) in predetermined positions of the interlayer insulating layer. Typically, contact holes formed in an interlayer insulating layer are for electrically connecting the electric circuit elements of the TFT layer with the organic EL elements 14.

Thus, the forming of the substrate 11, which includes the main body and the TFT layer, is completed.

(3) Bank Layer 12

As described above, the bank layer 12 defines a plurality of opening areas 12a. Further, the bank layer 12 serves as a wall partitioning hole transport layers 143 from one another and partitioning organic light-emitting layers 144 from one another. Specifically, the bank layer 12 restricts ink flow in the X direction during the forming of the hole transport layers 143 and the forming of the organic light-emitting layers 144. Further, in the panel 10 that has been manufactured, the bank layer 12 provides electrical insulation between hole transport layers 143 adjacent in the X direction and between organic light-emitting layers 144 adjacent in the X direction.

The bank layer 12 is formed by using a material having an electrically-insulative property. Example of materials usable for forming the bank layer 12 include: resin materials such as an acrylic resin, a polyimide resin, a silicone resin, and a phenol resin; and inorganic materials such as silicon nitride, silicon oxide, silicon oxynitride, and aluminum oxide. When using a resin material for the bank layer 12, beneficially, the resin material is one having photosensitivity to ensure high processability in the forming of the bank layer 12. Further, the resin material may be either a negative photosensitive resin or a positive photosensitive resin, but here, using a positive photosensitive resin is more beneficial. Further, the bank layer 12 may contain two or more materials, as long as including one of the materials described above. Alternatively, the bank layer 12 may be a combination of multiple layers each containing one of the material described above.

Further, beneficially, the bank layer 12 has resistance against organic solvents, heat, etc. In addition, beneficially, the bank layer 12 has liquid-repellency at surface portions thereof to achieve the function of restricting ink flow. This is achieved, for example, by forming the bank layer 12 by using a material having liquid repellency, or by performing surface treatment to provide the bank layer 12 with liquid repellency.

For example, the bank layer 12 can be formed through the following procedures. First, with the first electrodes 141, the hole injection layers 142, and the later-described pixel insulating layer 13 formed with respect to the top surface of the substrate 11, a resin material containing a material having liquid repellency, such as a fluorine compound, is applied with respect to the top surface of the substrate 11 through die coating. Here, the resin material is to be applied to form a film having a thickness greater than the thickness of the pixel insulating layer 13. Subsequently, each portion of the resin material that covers a line of first electrodes 141 (a line of hole injection layers 142) lined up along the Y direction is removed by performing photolithography, to provide the opening areas 12a in the bank layer 12. Thus, forming of the bank layer 12, which defines the opening areas 12a, is completed. Additionally performing baking of the resin material by using heat from a heat source, such as a hot air dryer, a hot plate, or an infrared lamp, after performing such patterning has the following benefits: increasing stability of the shape of the bank layer 12; increasing adhesion between the bank layer 12 and lower layer(s); increasing the liquid repellency of surfaces of the bank layer 12; etc. Meanwhile, one example of the bank layer 12 formed by using an inorganic material is a silicon oxide film that is formed by performing vacuum vapor deposition and patterning (e.g., photolithography or a metal mask process), and that has the opening areas 12a formed therein.

(4) Pixel Insulating Layer 13

The pixel insulating layer 13 is formed by using a material having an electrically-insulative property. The pixel insulating layer 13 improves the electrical insulation between blue sub-pixels SPB (i.e., blue organic EL elements 14B) in a same blue sub-pixel column CB. In the panel 10, the pixel insulating layer 13 is located between each pair of two first electrodes 141 adjacent along the Y direction, and extends along the X direction. Here, note that the pixel insulating layer 13 has a thickness that is greater than the total of the thickness of each first electrode 141 and the thickness of each hole injection layer 142, and that is smaller than the thickness of the bank layer 12. Due to having such a thickness, the pixel insulating layer 13 does not partition the hole transport layers 143 in a same blue sub-pixel column CB from one another or partition the organic light-emitting layers 144 in a same blue sub-pixel column CB from another. Thus, the pixel insulating layer 13 does not interfere with ink flow along the Y direction occurring during the forming of the hole transport layers 143 and during the forming of the organic light-emitting layer 144. Further, the pixel insulating layer 13 may be provided with additional functions, such as preventing layer discontinuation of the hole transport layers 143 and the organic light-emitting layers 144, and preventing the forming of short circuits between the first electrodes 141 and the second electrode 146.

Examples of materials having an electrically-insulative property that are usable for forming the pixel insulating layer 13 include the resin materials and the inorganic materials introduced above as examples of material usable for forming the bank layer 12. Further, so that ink for forming the hole transport layers 143 readily spreads and covers the pixel insulating layer 13, beneficially, the surfaces of the pixel insulating layer 13 have affinity with respect to ink.

For example, the pixel insulating layer 13 may be formed through the following procedures. First, with the first electrodes 141 and the hole injection layers 142 formed with respect to the top surface of the substrate 11, a resin material is applied with respect to the top surface of the substrate 11 through die coating. Here, the resin material is to be applied to form a film having a thickness greater than a total of the thickness of each first electrode 141 and the thickness of each hole injection layer 142. Then, patterning of the resin material is performed through photolithography, such that the resin material remains between each pair of two first electrodes 141 adjacent along the Y direction (and similarly, between each pair of two hole injection layers 142 adjacent along the Y direction) and extends along the X direction.

(5) Sealing Layer 15

The sealing layer 15 covers the entire top surface of the substrate 11 having members such as the bank layer 12, the pixel insulating layer 13, and the organic EL elements 14 disposed thereon. The sealing layer 15 protects each of such members on and above the substrate 11 from physical impact, moisture and oxygen in the atmosphere, and the like. For example, the sealing layer 15 is formed by using a material having a low moisture transmission rate. Examples of materials usable for forming the sealing layer 15 include inorganic materials such as silicon nitride, silicon oxynitride, carbon oxide, carbon nitride, and aluminum oxide. Further, considering that the panel 10 is a top-emission-type display panel, the sealing layer 15 is beneficially formed by using a material having high light transmissivity.

The forming of the sealing layer 15 may be performed, for example, by depositing a thin film of one of the inorganic materials described above through reactive sputtering so that the thin film covers the top surface of the substrate 11 having the bank layer 12, the pixel insulating layer 13, and the organic EL elements 14 formed thereon.

3. Effects

As described up to this point, the panel 10 includes: the substrate 11; the bank layer 12, which is disposed above the substrate 11 and defines the plurality of opening areas 12a; and the plurality of organic EL elements 14, each of which including one portion of an organic light-emitting layer 144 disposed within one of the opening areas 12a. The organic EL elements 14 in the panel 10 include the organic EL elements 14B, which emit blue light. Further, each organic EL element 14B includes: a first electrode 141; a portion of an organic light-emitting layer 144 that is disposed above the first electrode 141; and a portion of the second electrode 146 that is disposed above the portion of the organic light-emitting layer 144. Further, the portion of the organic light-emitting layer 144 in each blue organic EL element 14B contains an organic light-emitting material that emits blue light that has a CIE y coordinate no greater than 0.13 through photoluminescence. The following describes the effects yielded by this structure.

(1) Use of Effect of Optical Interference occurring in Organic EL Element

Typically, the color of light actually emitted by an organic light-emitting material does not exactly equal the color desired in a display panel (e.g., a color corresponding to a chromaticity defined in a visual image-related standard, such as NTSC, sRGB, or AdobeRGB). In particular, the CIE y coordinate of the color of light emitted from an organic light-emitting material emitting blue light tends to be greater than that of the desired color. This means that light actually emitted by an organic light-emitting material emitting blue light tends to have a lighter blue color than desired. For example, while the CIE y coordinate defined by a certain visual image-related standard may be approximately within a range between 0.06 and 0.08, the CIE y coordinate of light actually emitted by DSA-Ph (p-bis(p-N-N-diphenylaminostyryl)benzene) through photoluminescence, which is one type of organic light-emitting material emitting blue light, is approximately 0.181.

A conventional measure taken for reducing this difference in chromaticity between the color of actually emitted light and the desired color is adjusting the color of actually emitted light. One example of a measure for such adjustment is providing a color filter at a side of an organic EL element from which light is emitted, and removing unnecessary wavelength components included in the light emitted from the organic EL element at the color filter. However, such a color filter reduces the luminance of light emitted from the organic EL element. This leads to a decrease in light-emission efficiency. This decrease in light-emission efficiency reaches a considerable level particularly when the difference in chromaticity between the color of actually emitted light and the desired color (i.e., the color of light after passing through the color filter) is great. In view of this, in place of a color filter or in addition to a color filter, the effect of the optical interference occurring within an organic EL element is used for adjusting the color of light emitted from an organic EL element to reduce the difference in chromaticity between the color of actually emitted light and the desired color. The following describes this in detail.

Light generated by an organic light-emitting layer of an organic EL element exits the organic EL element via the first electrode or the second electrode (referred to in the following as an output-side electrode). Here, it should be noted that the light exiting the organic EL element (i.e., the light emitted from the organic EL element) is not only composed of light directly travelling from the organic light-emitting layer to the output-side electrode. That is, the light emitted from the organic EL element also includes light exiting the organic EL element after being reflected at one or more layer interfaces inside the organic EL element. This is due to the characteristic of light of being reflected at an interface between different members when the members have different refractive indexes. In particular, when the electrode opposite the output-side electrode has optical reflectivity, the light emitted from the organic EL element includes light having been reflected at this opposite electrode by a great proportion. Further, even if the output-side electrode has light transmissivity, not all of the light incident upon the output-side electrode simply passes through the output-side electrode and exits the organic EL element. That is, some of the light incident upon the output-side electrode is reflected at interfaces between the output-side electrode and layers at both sides of the output-side electrode (e.g., the interface between the second electrode 146 and the electron transport layer 145 and the interface between the second electrode 146 and the sealing layer 15 in the blue organic EL element 14B) and travels towards the inside of the organic EL element, before exiting the organic EL element after being reflected at least once again.

As such, light emitted from an organic EL element is a combination of light components having travelled through optical paths with different lengths inside the organic EL element after being generated, and the combining of such light components occurring in an organic EL element is typically referred to as optical interference in the organic EL element. This optical interference has an influence on light emitted from an organic EL element (referred to in the present disclosure as the effect of the optical interference), and the effect of the optical interference differs depending upon the difference in phase between the light components having travelled through optical paths with different lengths. Specifically, the effect of the optical interference may be strong or weak, depending upon wavelength of light. Further, the effect of the optical interference differentiates the spectrum of light emitted from an organic EL element from the spectrum of light emitted from the organic light-emitting material contained in the organic light-emitting layer of the organic EL element through photoluminescence, which is unique to the organic light-emitting material contained. Thus, the light emitted from an organic EL element differs in terms of both chromaticity and luminance from the light emitted from the organic light-emitting material.

However, seen in another way, this means that the difference in chromaticity between the color of light emitted from an organic EL element and the desired color can be reduced through the effect of the optical interference by appropriately adjusting the difference between the lengths of the optical paths that the light components travel through. Specifically, the lengths of the optical paths can be changed and optimized by, for example, changing the structure of layers disposed between the first and second electrodes and by changing the thicknesses of such layers.

Typically, the effect of the optical interference in an organic EL element is used in many cases in the designing of organic EL elements, both deliberately and non-deliberately. Deliberate use of the effect of the optical interference means deliberately controlling the effect of the optical interference, while non-deliberate use of the effect of the optical interference involves adjustment of layer structure, layer thickness, etc., in an organic EL element.

(2) Influence of Organic Light-emitting Layer Film Shape on Light Emission from Organic EL Element Typically, an organic light-emitting layer formed by using a wet process has a concave top surface, instead of a planar top surface. When an organic light-emitting layer has such a concave top surface, the thickness of the organic light-emitting layer differs between a center portion (i.e., a planar portion) thereof and an outer portion thereof. This results in an optical path passing through the center portion and an optical path passing through the outer portion having different lengths, which affects the effect of the optical interference described above. In addition, under certain manufacturing conditions, the concave top surface may also have surface irregularities. This results in optical path length differing at each part of the organic light-emitting layer, which further affects the effect of the optical interference described above. Meanwhile, it should be noted that the effect of the optical interference is a combination of mutual optical interference between light components having travelled through optical paths of various lengths, and thus, there lies difficulty in predicting the effect that the film shape of the organic light-emitting layer has on the effect of the optical interference. In particular, not many organic EL elements having organic light-emitting layers formed by using a wet process have reached the point of mass-production. Thus, not much knowledge has been accumulated so far regarding the effect that the film shape of an organic light-emitting layer has on the optical interference in an organic EL element having an organic light-emitting layer formed by using a wet process.

The circumstances being such, the inventors of the technology pertaining to the present disclosure (referred to in the following as the present inventors) carried out an investigation regarding how the effect of the optical interference differs between a blue organic EL element including an organic light-emitting layer that is formed by using a wet process and thus is not planar (referred to in the following as a "non-planar element") and a blue organic EL element including a planar organic light-emitting layer (referred to in the following as a "planar element"). Through this investigation, the present inventors found that when both a non-planar element and a planar element are configured to emit light with a predetermined chromaticity that is close to the chromaticity of the desired color through controlling the effect of the optical interference, the luminance of light emitted from a non-planar element is lower than the luminance of light emitted from a planar element. Note that in the following, the chromaticity and luminance of light emitted from an element (a non-planar element or a planar element) is an average chromaticity and luminance at the entirety of a light-emitting surface of the element. Further, in the present disclosure, the situation where the luminance of light emitted from a non-planar element is lower than the luminance of light emitted from a planar element is referred to by using the expression "luminance drop due to film shape".

Figure 4:
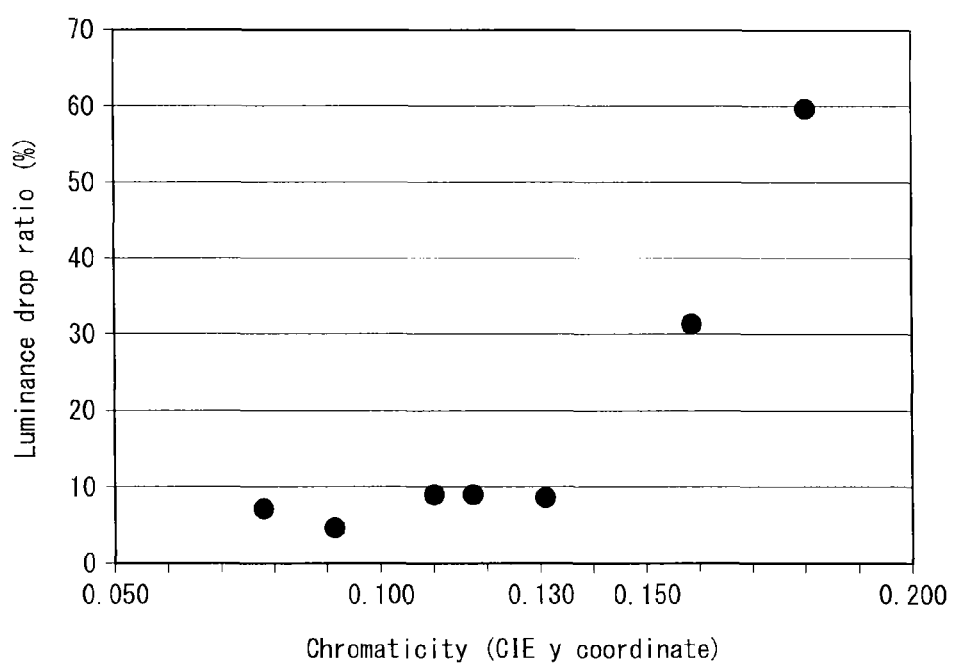
FIG. 4 is a graph illustrating, for each of a plurality of organic light-emitting materials, a relationship between a luminance drop ratio of the organic light-emitting material and a chromaticity of light emitted from the organic light-emitting material through photoluminescence.

FIG. 4 is a graph illustrating, for each of multiple organic light-emitting materials, a relationship between the chromaticity of the organic light-emitting material in photoluminescence and a ratio of the luminance drop due to film shape between a planar element and a non-planar element prepared by using the organic light-emitting material. The horizontal axis of the graph plots, for each organic light-emitting material, a CIE y coordinate in photoluminescence. Meanwhile, the vertical axis of the graph plots luminance drop ratios. Here, a luminance drop ratio is a ratio indicating the amount by which the luminance of a non-planar element is lower than the luminance of a planar element when the predetermined chromaticity was set to a CIE y coordinate of 0.065. Specifically, the denominator of the luminance drop ratio indicates the luminance of light emitted from a planar element, and the numerator of the luminance drop ratio indicates a difference when subtracting the luminance of light emitted from a non-planar element from the luminance of light emitted from the planar element.

Note that the graph is based on data acquired from planar elements and non-planar elements that differ only in terms of the shapes of the organic light-emitting layers included therein, and that do not differ in terms of any other aspect, such as material, electrical condition applied, and shapes of other layers. That is, the only difference between a planar element and a non-planar element is the difference between the thickness of the organic light-emitting layers included therein. The thickness of the organic light-emitting layer in a planar element and the thickness of the organic light-emitting layer in a non-planar element were differentiated to control the effect of the optical interference and configure the planar element and the non-planar element to emit light with the same CIE y coordinate of 0.065.

For example, the CIE y coordinate in photoluminescence of a typical organic light-emitting material, such as DSA-Ph, is around 0.18. However, as illustrated in the graph in FIG. 4, using such an organic light-emitting material resulted in a considerably great luminance drop ratio of approximately 60%. While the value of the luminance drop ratio may change depending upon organic EL element structure, the results illustrated in FIG. 4 indicate that generally, the luminance of emitted light emitted from a non-planar element is lower than the luminance of light emitted from a planar element when both elements are configured to emit light having the predetermined chromaticity, which is close to that of the desired color.

(3) Luminance Drop due to Film Shape, with Blue Organic EL Element 14B

As already described above, the organic light-emitting layer 144 of the blue organic EL element 14B (referred to in the following as the element 14B) contains an organic light-emitting material emitting, through photoluminescence, blue light with a CIE y coordinate no greater than 0.13. When using such an organic light-emitting material, the luminance drop due to film shape is suppressed to 10% or smaller. Thus, it is clear that the luminance drop due to film shape is smaller with the element 14B than with an organic EL element in which a typical organic light-emitting material is used.

The following provides an observation on how this effect is produced. The control of the effect of the optical interference in an organic EL element, which is achieved for example by forming a optical microresonator in the organic EL element as described above and which has an effect of improving the color purity, the luminance, etc., of light emitted from the organic EL element, is brought about by an optical filter being formed, or that is, by removing color components other than desired color components. Thus, it can be said that controlling the effect of the optical interference is similar to providing a color filter or the like. Meanwhile, when too strong an optical filter is applied to an organic EL element, the proportion of desired light components being removed along with unnecessary color components increases.

In view of this, consideration is made once again of the light emitted from a planar element and the light emitted from a non-planar element. In a planar element, optical paths leading to different areas of the light-emitting surface have the same length, and thus, light components emitted from the light-emitting surface have the same chromaticity, which is the predetermined chromaticity. Meanwhile, in a non-planar element, optical paths leading to different areas of the light-emitting surface have various differing lengths, and thus, light components emitted from the light-emitting surface include light components having the predetermined chromaticity and also light components having different chromaticity. This means that when configuring a planar element and a non-planar element to emit light having the same predetermined chromaticity while using the same light-emitting material by using an optical filter, a stronger optical filter needs to be applied to the non-planar element than the planar element. This, as already described above, means that the luminance of light emitted from the non-planar element inevitably becomes considerably lower than the luminance of light emitted from the planar element.

Meanwhile, it should be noted that the level of this difference between the luminance of light emitted from a planar element and the luminance of light emitted from a non-planar element changes considerably depending upon the level of the difference between the predetermined chromaticity and the chromaticity of the light-emitting material used. Specifically, when the CIE y coordinate of the light-emitting material used is great (i.e., the light-emitting material emits a light blue color), or that is, when the difference between the desired chromaticity and the original chromaticity of the light-emitting material used is great, the strong optical filer of the non-planar element removes a considerable proportion of desired light components. Meanwhile, when the CIE y coordinate of the light-emitting material used is small (i.e., the light-emitting material emits a deep blue color), or that is, when the difference between the desired chromaticity and the original chromaticity of the light-emitting material used is small, the strong optical filter of the non-planar element removes a relatively small proportion of desired light components. That is, with a non-planar element, the amount of desired light components removed by the optical filter can be reduced considerably by using a light-emitting material emitting light with a small CIE y coordinate.

Meanwhile, due to the optical filter being applied to a planar element not being as strong as the optical filter applied to a non-planar element as described above, even when using a light-emitting material emitting light with a small CIE y coordinate (i.e., even when the difference between the desired chromaticity and the original chromaticity of the light-emitting material used is small), the reduction in the proportion of desired light components removed by the optical filter remains relatively small.

Based on the mechanism described above, the present inventors considered that with a non-planar element, it is effective to use a light-emitting material emitting a deep blue color to reduce the luminance drop due to film shape.

Further, according to the graph illustrated in FIG. 4, it can be seen that saturation is reached when the CIE y coordinate of the color of light that an light-emitting material emits through photoluminescence is 0.13. Accordingly, the organic light-emitting layer 144 of the blue organic EL element 14B contains an organic light-emitting material emitting, through photoluminescence, blue light (deep blue color) with a CIE y coordinate no greater than 0.13. Thus, light emission from the blue organic EL element 14B is affected less by the film shape of the organic light-emitting layer 144 when the organic light-emitting layer 144 contains such an organic light-emitting material emitting deep blue light compared to when the organic light-emitting layer 144 contains an organic light-emitting material emitting a light blue color.

Further, due to the panel 10 including the element 14B, whose light emission is not affected much by the film shape of the organic light-emitting layer 144 included therein, the panel 10 has a quality close to what is expected at the point of designing. That is, the panel 10 has high quality.

(4) Conclusion

The blue organic EL element pertaining to one aspect of the present disclosure has an organic light-emitting layer containing organic light-emitting material that emits a deep blue color. Thus, the luminance drop in emitted light occurring due to film shape is smaller with the blue organic EL element pertaining to one aspect of the present disclosure than with an organic EL element whose organic light-emitting layer contains organic light-emitting material that emits a light blue color. As such, it can be said that light emission from the blue organic EL element pertaining to one aspect of the present disclosure is not affected much by the film shape of the organic light-emitting layer.

4. Notes (1) Shape of Organic Light-emitting Layer 144

With the element 14B, the luminance drop due to film shape becomes even smaller when the difference between the maximum and the minimum of the thickness of a light-emitting portion of the organic light-emitting layer 144 is no smaller than 10% of the average thickness within the light-emitting portion. The following describes this in detail.

Figure 5:
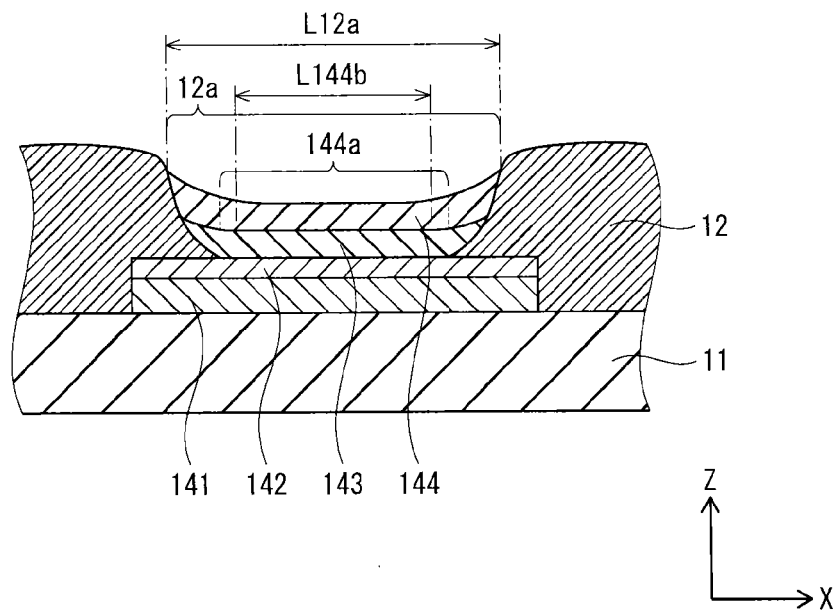
FIG. 5 is a schematic illustrating a cross-section utilized for explaining a shape of an organic light-emitting layer 144.

FIG. 5 is a schematic illustrating a cross-section utilized for explaining the shape of the organic light-emitting layer 144. Note that in order to simply explanation, FIG. 5 does not illustrate the layers on and above the organic light-emitting layer 144 in FIG. 3A (i.e., the electron transport layer 145, the second electrode 146, and the sealing layer 15).

In the element 14B, in the forming of each opening area 12a, the lateral surfaces of the bank layer 12 do not become perpendicular with respect to the substrate 11, and instead, are inclined with respect to the substrate 11, and provide the openings are 12a with a forward tapered shape. Thus, portions of the hole transport layer 143 near the bank layer 12 are not in direct in contact with the hole injection layer 142, and the bank layer 12 is interposed between each of such portions of the hole transport layer 143 and the hole injection layer 142. Here, it should be noted that the hole injection layer 142 is not capable of directly injecting holes into such portions of the hole transport layer 143 located above a portion of the bank layer 12. Thus, current is not likely to flow through such portions of the hole transport layer 143, which results in portions of the organic light-emitting layer 144 above such portions of the hole transport layer 143 emitting a smaller amount of light compared to other portions of the organic light-emitting layer 144. In particular, portions of the organic light-emitting layer 144 immediately near the bank layer 12 barely emits any light.

To summarize the above, not the entire organic light-emitting layer 144 emits light. That is, the organic light-emitting layer 144 includes a light-emitting portion 144a at the center portion thereof and non-light-emitting portions at outer portions thereof In the present disclosure, the classification of whether a certain portion of the organic light-emitting layer 144 is a light-emitting portion 144 or a non-light-emitting portion is made depending upon the luminance of light emitted from the portion. Specifically, each portion of the organic light-emitting layer 144 emitting light at a luminance no greater than 50% of the average luminance of the organic light-emitting layer 144 is classified as a non-light-emitting portion.

Further, an assumption can be made that the luminance drop due to film shape becomes prominent particularly when the light-emitting portion 144a is not planar. Typically, an organic light-emitting layer has a planar center portion even when formed by using a wet process. Thus, the light-emitting portion 144a is considered as not being planar when the light-emitting portion 144a includes a non-planar portion in addition to the planar portion corresponding to the center portion of the organic light-emitting layer 144. Further, the planar portion can be defined as a portion of the organic light-emitting layer 144 where the difference between the maximum thickness and the minimum thickness within the portion is no greater than 10% of the average film thickness within the light-emitting part 144a. As such, the light-emitting portion 144a is considered as including the non-planar portion when the difference between the maximum and the minimum of the thickness of the light-emitting portion 144a of the organic light-emitting layer 144 is no smaller than 10% of the average thickness of the light-emitting portion 144a. When the light-emitting portion 144a includes such a non-planar portion, the luminance drop due to film shape becomes considerable, and seen in a different way, the effect of the element 14B of suppressing the luminance drop due to film shape becomes prominent.

(2) Width of Opening Area 12a

The luminance drop due to film shape becomes considerable when the panel 10 is a high definition panel. Specifically, the luminance drop due to film shape becomes prominent when, in a transverse cross-section of a blue sub-pixel column CB, a ratio L144b/L12a, which is the ratio of a length L144b of the planar portion of the light-emitting portion 144a to a length L12a of the opening area 12a, is no greater than 2/3. The following explains this in detail, comparing FIG. 5 and FIG. 6. Note that in the present disclosure, a transverse cross-section of an object indicates a cross-section of the object taken along the direction perpendicular to the direction in which the object extends. Specifically, a transverse cross-section of a blue sub-pixel column CB is a cross-section taken along a direction perpendicular to the Y direction in the drawings (i.e., the X-Y cross-sections illustrated in FIG. 3A, FIG. 5, and FIG. 6). The Y direction is the direction in which each blue sub-pixel column CB extends. Further, in the following, the term "width" is used to indicate in particular a length of an object along the horizontal direction (corresponds to the X direction in the drawings) in a transverse cross-section of the object.

Figure 6:
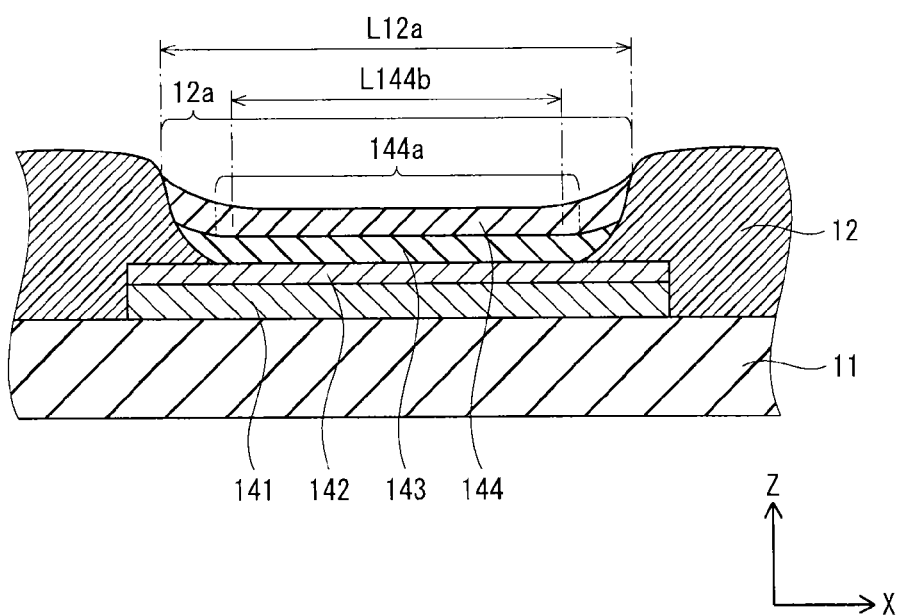
FIG. 6 is a schematic illustrating a cross-section utilized for explaining another shape of the organic light-emitting layer 144.

FIG. 6 is a schematic illustrating a cross-section utilized for explaining another shape of the organic light-emitting layer 144. FIG. 6 illustrates a panel having lower definition than that illustrated in FIG. 5. The high definition panel in FIG. 5 and the low definition panel in FIG. 6 differ in terms of the width L12a of the opening area 12a. Specifically, the members illustrated in FIG. 5 and FIG. 6 have the same shape (film thickness, shapes of lateral surfaces, etc.,) while some members have different widths in FIG. 5 and FIG. 6 due to the width L12a of the opening area 12a differing between FIGS. 5 and 6.

First of all, an assumption can be made that the width of the non-planar portion of the organic light-emitting layer 144 changes depends upon the difference between the height of the position of the bank layer 12 where ink pins to in the forming of the organic light-emitting layer 144 and the height of the top surface of the planar portion of the organic light-emitting layer 144. Based on this, an assumption can be made that when the lateral shape of the bank layer 12 and the height of the planar portion of the organic light-emitting layer 144 are fixed, the width of the non-planar portion of the organic light-emitting layer 144 is not dependent upon the width L12a of the opening area 12a. Thus, it can be said that the smaller the width L12a of the opening area 12a, the greater the proportion of the non-planar portion in the light-emitting portion 144a in the transverse cross-section of the light-emitting portion 144a. When the proportion of the non-planar portion in the light-emitting portion 144a increases, the luminance drop due to film shape becomes even more considerable, and seen in a different way, the effect of the element 14B of suppressing the luminance drop due to film shape becomes even more prominent.

In fact, the present inventors have found through research that when the ratio L144b/L12a is no greater than 2/3, the effect of the element 14B of suppressing the luminance drop due to film shape becomes even more prominent. Accordingly, it is particularly beneficial to apply the element 14B to a high definition panel such as that yielded by setting L144b/L12a to no greater than 2/3 in the panel 10.

Here, note that the ratio L144b/L12a is that in a transverse cross-section such as that taken along line 3a-3a in FIG. 2, which passes through the center of the light-emitting surface of the element 14B, and not that in a transverse cross-section passing through an outer portion of the element 14B. Further, as illustrated in FIGS. 5 and 6, the width L12a is a width of the opening area 12a at the top end of the opening. The top end of the opening area 12a is specified based on the angle of inclination of the surface of the bank layer 12 with respect to the horizontal direction (i.e., the direction parallel to the top surface of the substrate 11 or the bottom surface of the first electrode 141). Specifically, the top end of the opening area 12a corresponds to a portion of the bank layer 12 along the width direction where the inclination angle of the bank layer 12 first exceeds 30 degrees.

In the above, the symbol "L12a" refers to the width of the opening area 12a of the bank layer 12. However, the symbol "L12a" may refer to the length of the organic light-emitting layer 144 in a cross-section of the element 14B. That is, the effect of the element 14B of suppressing the luminance drop due to film shape becomes even more prominent when, among cross-sections of the element 14B, there exists a cross-section in which the ratio L144b/L12a, which here is the ratio of the length L144b of the planar portion of the light-emitting portion 144a to the length L12a of the organic light-emitting layer 144, is no greater than ⅔.

Here, a cross-section of the element 14B is that obtained by cutting the element 14B in the thickness direction (e.g., the cross-sections in FIGS. 3 (3A?), 5, and 6), and that passes through the center of the light-emitting surface of the element 14B, as illustrated for example by line 3a-3a in FIG. 2, and not through an outer portion of the element 14B. Further, in a cross-section of the element 14B, when the length of the organic light-emitting layer 144 changes at different vertical direction positions, such as illustrated in FIGS. 3A, 5, and 6, the maximum length of the organic light-emitting layer 144, or that is, the length of the organic light-emitting layer 144 between top ends thereof where the organic light-emitting layer 144 spreads out towards the bank layer 12 is considered as the width L12a.

(3) Chromaticity

Beneficially, the organic light-emitting material contained in the element 14B emits blue light with a CIE y coordinate no smaller than 0.05 through photoluminescence. The following describes this in detail.

Typically, an organic light-emitting layer in an organic EL element contains a host and a dopant. The host is doped with the dopant, which is the organic light-emitting material. A typical organic light-emitting layer contains such materials since an organic light-emitting layer needs to achieve both excellent light-emission efficiency and excellent carrier transportability (hole mobility, electron mobility, etc,). However, a single organic material having both such characteristics at a high level does not exist at this point, and due to this, a typical organic light-emitting layer contains both a dopant having excellent light-emission efficiency and a host having excellent carrier transportability. Due to this, typically, an organic material that has lower light-emission efficiency than the dopant and that is not likely to emit light when carriers recombine therein is used as the host.

Here, what is referred to as an organic material not likely to emit light is an organic material requiring a large amount of energy to be put in excitation state, or that is, an organic material emitting light with a short wavelength when caused to emit light. Within the wavelength range of blue light for example, what is referred to as an organic material not likely to emit light is an organic material emitting light with a small CIE y coordinate. Specifically, the CIE y coordinate of light emitted through photoluminescence by an organic material typically used as a host is around 0.05. For example, the CIE y coordinate of light emitted through photoluminescence by MADN (2-methyl-9,10-di(2-naphthyl)anthracene), which is one typical material used as a host, is approximately 0.052.

When using such host material in combination with a dopant emitting light with a CIE y coordinate smaller than 0.05 through photoluminescence, the application of an energy amount putting the dopant in excitation state would also put the host material in excitation state and in consequent light-emitting state. Typically, the host has lower light-emission efficiency than the dopant. Due to this, light emission by the host leads to a reduction in the light-emission efficiency of the organic EL element as a whole. In view of this, beneficially, the organic light-emitting material (dopant) contained in the element 14B emits blue light with a CIE y coordinate no smaller than 0.05 through photoluminescence. When such an organic light-emitting material is used as the dopant, the light emission by the host and the consequent reduction in light-emission efficiency can be suppressed. More beneficially, the organic light-emitting material in the element 14B emits blue light with a CIE y coordinate no smaller than 0.10 through photoluminescence.

(4) Effect of Optical Interference

In the element 14B, the stronger the optical interference inside the element, the greater the luminance drop due to film shape occurring. Accordingly, beneficially, at least one of the first electrode 141 and the second electrode 146 has optical reflectivity (e.g., at least one of the first electrode 141 and the second electrode 146 reflects 90% or more of the light emitted from the organic light-emitting material). This strengthens the effect of the optical interference, and makes more prominent the effect of the element 14B of suppressing the luminance drop due to film shape. Further beneficially, the element 14B includes an optical microresonator that is composed of the first electrode 141 and the second electrode 146 and that strengthens blue light. This strengthens the effect of the optical interference and makes even more prominent the effect of the element 14B of suppressing the luminance drop due to film shape. Such an optical microresonator can be simply formed by providing both the first electrode 141 and the second electrode 146 with optical reflectivity. This can be achieved, for example, by using a metal having high optical reflectivity for one of the two electrodes, and using a semi-transparent metal, a DBR, or the like for the other one of the two electrodes.

However, even if neither the first electrode 141 nor the second electrode 146 has a considerable level of optical reflectivity, the effect of the optical interference is present due to at least some light components being reflected at an interface between any two members having different refractive indexes. Thus, the element 14B achieves the above-described effect thereof.

(5) Supplement

In the above, the organic light-emitting layer 144 in the panel 10 has a concave top surface due to being formed by using a wet process. However, considering how the effect of reducing the luminance drop due to film shape of the organic light-emitting layer is achieved in the panel 10, this effect is not only achieved when the organic light-emitting layer 144 has a concave top surface. Specifically, this effect is not only achieved when the organic light-emitting layer 144 is formed by using a wet process, and is achieved as long as the organic light-emitting layer 144 is not completely planar. For example, this effect is achieved when the top surface of the organic light-emitting layer 144 has a convex shape, when the top surface of the organic light-emitting layer 144 has surface roughness at a part thereof, and when the top surface of the organic light-emitting layer 144 has surface irregularity at multiple portions thereof. Further, this effect is achieved not only when the organic light-emitting layer 144 has a non-planar top surface, but also when the organic light-emitting layer 144 has a non-planar bottom surface. That is, this effect is achieved, for example, when the organic light-emitting layer 144 has a planar top surface and a non-planar bottom surface, and when the organic light-emitting layer 144 has a non-planar top surface and a non-planar bottom surface. Further, the greater the degree of non-planarity, the greater the effect achieved.

The panel 10 includes sub-pixels forming a matrix. The matrix is composed of lines each composed of a plurality of sub-pixels emitting different colors of light (referred to in the following as sub-pixel rows), and lines each composed of a plurality of sub-pixels emitting the same color of light (referred to in the following as sub-pixel columns). Further, in the above, the sub-pixel rows extend along the X direction and the sub-pixel columns extend along the Y direction, as illustrated in FIG. 2. However, a modification may be made such that the sub-pixel rows extend along the Y direction and the sub-pixel columns extend along the X direction. Further, the sub-pixel rows and columns need not extend along the X direction (being a direction parallel to the longer sides of the image display surface of the panel 10) or the Y direction (being a direction parallel to the shorter sides of the image display surface of the panel 10). In addition, when making such modifications, the direction along which the bank layer 12 extends and the direction along which the pixel insulating layer 13 extends may be changed as necessary. Note that each of the bank layer 12 and the pixel insulating layer 13 may extend in any direction, provided that the bank layer 12 and the pixel insulating layer 13 intersect one another. Further, the bank layer 12 and the pixel insulating layer 13 may intersect with one another at any angle, not limited to intersecting with one another at 90°.

In the above, the panel 10 includes red sub-pixels SPR emitting red light, green sub-pixels SPG emitting green light, and blue sub-pixels SPB emitting blue light. However, the panel 10 is not limited to including sub-pixels emitting such specific colors. For example, the panel 10 may include only sub-pixels emitting blue light, or may include sub-pixels emitting four different colors, such as red, green, blue, and yellow. Further, each pixel P need not include one sub-pixel per each color, and may include two or more sub-pixels per each color. Further, the sub-pixels in each pixel P need not be arranged in the order illustrated in FIG. 2 (i.e., the order of red, green, and blue), and may be arranged in a different order. Further, a modification may be made such that all of the organic EL elements 14 in the panel 10 are blue light-emitting elements 14B, and the panel 10 emits red and green light in addition to blue light by wavelength converters, such as phosphors or color filters, being disposed above the organic EL elements 14 as necessary.

In the above, in the panel 10, one first electrode 141 and one hole injection layer 142 are provided per each organic EL element 14, one hole transport layer 143 and one organic light-emitting layer 144 are provided per each sub-pixel column, and one electron transport layer 145 and one second electrode 146 are provided for the entire panel 10. However, each of such layers need not be formed to cover the above-described areas in the panel 10. That is, the area in the panel 10 that each layer covers may be changed as necessary, and a given layer may be provided in plurality to correspond one-to-one with the organic EL elements 14, may be provided in plurality to correspond one-to-one with the sub-pixel columns, or may be provided in singularity to cover the entire panel 10.

The layers included in the panel 10 above are mere examples of layers that could be included in the panel 10. For example, the panel 10 may include an electron injection layer, a blocking layer blocking moisture, oxygen, or the like, and a buffer layer in addition to the layers described above. Further, the panel 10 may not include one or more of the layers described above. Further, the panel 10 may include a layer that is considered as a single layer physically but has two or more functions, such as an electron injection/transport layer. Further, the panel 10 may include a sealing plate that is disposed on or above the sealing layer 15, that is made of a similar material as the substrate 11 (e.g., a glass material), and that protects the layers of the panel 10. When providing such a sealing plate, filling a space between the sealing layer 15 and the sealing plate with curable resin material, for example, increases the adhesion between the sealing layer 15 and the sealing plate. Further, when providing such a sealing plate, color filters may be disposed at positions of the sealing plate corresponding to the sub-pixels 100R, 100G, and 100B to adjust light-emission color. Further, black matrices may be additionally disposed at positions of the sealing plate corresponding to the intervals between adjacent ones of the sub-pixels 100R, 100G, and 100B and at a peripheral area of the sealing plate for purposes such as suppressing reflection of light from outside the panel 10 and improving contrast. Further, the panel 10 may include the sealing plate described above in place of the sealing layer 15.

Further, in the above, the image display surface of the panel 10 has a rectangular shape. However, the image display surface may have any shape, examples of which include: a polygonal shape such as a triangular, a square, or a pentagonal shape; a circular shape; an oval shape; and any combination of one or more of such shapes. Further, an image display region of the image display surface (i.e., the region of the image display surface within which the sub-pixels 100R, 100G, and 100B are arranged) may have the same shape as the image display surface, or may have a shape different from that of the image display surface. For example, the image display surface may have a rectangular shape and the image display region may have an oval shape. Further, the substrate 11 of the panel 10 may have a shape corresponding to the shape of the image display surface. Alternatively, the shape of the substrate 11 may be such that a surface of the substrate 11 outside the image display surface has a shape different from that of the image display surface.

Further, in the above, each first electrode 141 of the panel 10 has a rectangular, flat plate-like shape. However, the first electrode 141 may have other shapes, examples of which include: a polygonal, flat plate-like shape; a circular, flat plate-like shape; an oval, flat plate-like shape; and any combination of one or more of such shapes. Further, the first electrode 141 may have concave portions with shapes that are in accordance with the shapes of the contact holes in the interlayer insulating layer of the substrate 11.

In the above, in the panel 10, the first electrode 141 serves as an anode and the second electrode 146 serves as a cathode. However, the panel 10 may have a reversed structure, in which case the first electrode 141 serves as a cathode and the second electrode 146 serves as an anode. When making such a modification, the order in which layers such as the hole injection layer, the hole transport layer, and the electron transport layer are layered in the panel 10 is changed as necessary Further, the opening areas 12a in the panel may have disposed therein, in addition to the organic EL elements 14, bus bars (auxiliary electrodes) formed by using a metal having high electrical conductivity. The provision of such bus bars in the opening areas 12a reduces the influence of voltage drop occurring due to the slight resistance inherent to the second electrode 146.

The methods described above for forming the respective layers of the panel 10 are mere examples of applicable methods. The forming of each component of the panel 10 may be performed according to any suitable method, including the methods described above and other dry processes, other wet processes, other patterning methods, and other drying methods. Further, in the above, the hole transport layers 143 are formed by using a wet process, whereas each of the first electrodes 141, the hole injection layers 142, the electron transport layer 145, the second electrode 146, and the sealing layer 15 is formed by using a dry method. However, a layer formed by using a wet process in the above may be formed by using a drying process and a layer formed by using a dry process in the above may be formed by using a wet process, as long as suitable.

In the above, the panel 10 is a top-emission type panel and uses the active-matrix scheme. However, the panel 10 may be a bottom-emission type panel and may use the passive-matrix scheme.

Further, description is provided in the embodiment that the blue organic EL element 14B is used in a display panel. However, the blue organic EL element 14B may be used in a lighting device, or as a light-emitting element for backlight.

Note that the modifications described up to this point are to be applied to the blue organic EL element 14B and the panel 10 while making necessary changes thereto based on conventional technology to such an extent that the effects of the organic EL element 14B and the panel 10 are not spoiled.

Although the technology pertaining to the present disclosure has been fully described by way of examples with reference to the accompanying drawings, it is to be noted that various changes and modifications will be apparent to those skilled in the art. Therefore, unless such changes and modifications depart from the scope of the present disclosure, they should be construed as being included therein.

The invention claimed is:

1. An organic electroluminescence (EL) element emitting blue light from a light emitting surface and comprising:
   a first electrode;
   an organic light-emitting layer disposed on the first electrode and/or closer to the light emitting surface than the first electrode; and
   a second electrode disposed on the organic light-emitting layer and/or closer to the light emitting surface than the organic light-emitting layer, wherein
   the organic light-emitting layer contains an organic light-emitting material emitting, through photoluminescence, blue light that has a CIE y coordinate no greater than 0.13 such that a luminance drop due to film shape is suppressed to 10% or smaller.

2. The organic EL element of claim 1, wherein
   at least a part of the organic light-emitting layer acts as a light-emitting portion, and
   a difference between a maximum and a minimum thickness of the organic light-emitting layer within the light-emitting portion is no smaller than 10% of an average thickness of the organic light-emitting layer within the light-emitting portion.

3. The organic EL element of claim 2, wherein
   in at least one cross-section of the organic EL element, a planar portion of the light-emitting portion occupies no more than two thirds of a length of the organic light-emitting layer.

4. The organic EL element of claim 3, wherein
   the organic light-emitting layer has a concave top surface.

5. The organic EL element of claim 1, wherein
   at least one of the first electrode and the second electrode has optical reflectivity.

6. The organic EL element of claim 5, wherein
   the first electrode and the second electrode, together, form an optical microresonator that amplifies blue light.

7. The organic EL element of claim 1, wherein
   the organic light-emitting material emits, through photoluminescence, blue light that has a CIE y coordinate no smaller than 0.05.

8. The organic EL element of claim 1, wherein
   at least at a part of the organic light-emitting layer, a thickness of the organic light-emitting layer decreases when approaching a center portion of the organic light-emitting layer from an outer portion of the organic light-emitting layer.

9. An organic EL display panel comprising:
   a substrate;
   a bank layer disposed on the substrate and/or closer to a light emitting surface than the substrate, the bank layer defining opening areas; and
   a plurality of organic EL elements, the plurality of organic EL elements each including an organic light-emitting layer disposed in a respective one of the opening areas, wherein
   the plurality of organic EL elements include at least one organic EL element emitting blue light, and
   an organic light-emitting layer of the at least one organic EL element emitting blue light contains an organic light-emitting material emitting, through photoluminescence, blue light that has a CIE y coordinate no greater than 0.13 such that a luminance drop due to film shape is suppressed to 10% or smaller.

10. The organic EL display panel of claim 9, wherein
the plurality of organic EL elements include a plurality of organic EL elements emitting blue light,
the plurality of organic EL elements form rows and columns along a top surface of the substrate forming a matrix, and
the matrix includes at least one column composed of only the plurality of organic EL elements emitting blue light.

11. The organic EL display panel of claim 10, wherein
at least a part of the organic light-emitting layer acts as a light-emitting portion,
a difference between a maximum and a minimum thickness of the organic light-emitting layer at the light-emitting portion is no smaller than 10% of an average thickness of the organic light-emitting layer within the light-emitting portion, and
in a transverse cross-section of each column in the matrix, a planar portion of the light-emitting portion occupies no more than two thirds of a length of the organic light-emitting layer.

12. The organic EL display panel of claim 10, wherein
the opening areas extend along the columns in the matrix forming an extended opening area, and
in each of the opening areas, a respective organic light-emitting layer of a respective organic EL element disposed in the respective opening area is continuous with organic light-emitting layers of each of remaining organic EL elements disposed in the extended opening area.

13. A manufacturing method of an organic EL element emitting blue light and including a first electrode, an organic light-emitting layer, and a second electrode that are layered in a stated order, the manufacturing method comprising:
forming the organic light-emitting layer through application and drying of an ink containing an organic light-emitting material, the organic light-emitting material emitting, through photoluminescence, blue light that has a CIE y coordinate no greater than 0.13 such that a luminance drop due to film shape is suppressed to 10% or smaller.

* * * * *